(12) United States Patent
Tamba

(10) Patent No.: US 7,161,514 B2
(45) Date of Patent: Jan. 9, 2007

(54) CALIBRATION METHOD FOR INTERLEAVING AN A/D CONVERTER

(75) Inventor: Mamoru Tamba, Tokyo (JP)

(73) Assignee: Agilent Technologies, Inc., Palo Alto, CA (US)

(*) Notice: Subject to any disclaimer, the term of this patent is extended or adjusted under 35 U.S.C. 154(b) by 101 days.

(21) Appl. No.: 10/279,493

(22) Filed: Oct. 24, 2002

(65) Prior Publication Data

US 2003/0080885 A1 May 1, 2003

(30) Foreign Application Priority Data

Oct. 26, 2001 (JP) .................................... 2001-329209

(51) Int. Cl.
*H03M 1/10* (2006.01)

(52) U.S. Cl. ...................................... 341/120; 341/155

(58) Field of Classification Search ................ 341/120, 341/155

See application file for complete search history.

(56) References Cited

U.S. PATENT DOCUMENTS

| 4,763,105 A | * | 8/1988 | Jenq ............................ 341/120 |
| 5,239,299 A | | 8/1993 | Apple et al. ................. 341/118 |
| 5,294,926 A | | 3/1994 | Corcoran .................... 341/120 |

FOREIGN PATENT DOCUMENTS

| DE | 38 85 166 | 5/1994 |
| DE | 100 07 148 | 8/2000 |
| DE | 100 15 384 | 10/2000 |
| JP | 61-053829 | 3/1986 |
| JP | 61053829 | 3/1986 |
| JP | 04-267628 | 9/1992 |
| JP | 04267628 | 9/1992 |
| JP | 05-180878 | 7/1993 |
| JP | 06-249913 | 9/1994 |

OTHER PUBLICATIONS

German Search Report Application No. 102 49 864.4, no date.

Fu, D. et al. "Digital Background Calibration of a 10B 40MSample/s Parallel Pipelined ADC," 1998, IEEE International Solid State Circuits Conference, S. 140,141.

"Digital Background Calibration of a 10b 40Msample/s Parallel Pipelined ADC," D. Fu, K. Dyer, S. Lewis and P. Hurst, 1998, no month.

* cited by examiner

*Primary Examiner*—Brian Young

(57) ABSTRACT

A method and low cost apparatus to accurately determine the gain, offset, and/or skew calibration values of each A/D converter in a few steps for an interleaving A/D converter. The calibration method includes: applying sine waves to the input as a calibration signal during calibration, A/D converting of the sine wave by a plurality of A/D conversion means in a predetermined order and storing the converted data in a data storage memory, and determining the gain, offset, and/or skew calibration values by using sine curve fitting on a sequence of converted data for each of the plurality of A/D conversion means.

6 Claims, 4 Drawing Sheets

CALIBRATION METHOD FOR INTERLEAVING AN A/D CONVERTER

BACKGROUND OF THE INVENTION

1. Field of the Invention

The present invention relates to an interleaving A/D converter and more particularly to calibrate an interleaving A/D converter that A/D converts by repeatedly operating in parallel a plurality of A/D conversion circuits in a predetermined order.

2. Discussion of the Background Art

The interleaving A/D converter operates a plurality of A/D conversion circuits in parallel in a predetermined order. The gain and offset errors of each A/D conversion circuit and the conversion clock signal skew become noise containing spurious components. For example, when the A/D conversion circuit is constructed from two elements, spurious components appear between the Nyquist frequency and the signal frequency and cause an increase in the noise floor.

By convention, various calibration methods to calibrate the interleaving A/D converter are the offset correction method using the direct current signal as disclosed in Unexamined Japanese Patent Publication No. S61[1986]-53829, the timing calibration method that focuses on the zero crosspoints as disclosed in Unexamined Japanese Patent Publication No. H4[1992]-267,628, and the method in "Digital Background Calibration of a 10b 40M Sample/s Parallel Pipelined ADC," 1998 *IEEE International Solid-State Circuits Conference*, pp. 140–141, that corrects the skew error by using random noise as the calibration signal and the sample-and-hold amplifier (SHA) according to D. Fu et al. However, these calibration methods have the following problems.

1) None of the methods can determine the gain, offset, and skew calibration values for each of the plurality of A/D conversion circuits in one try and must combine a plurality of calibration methods. Therefore, the calibration takes time. Preparing the hardware (H/W) required for each calibration method is expensive.

2) In the method by Fu et al., the signal-to-noise ratio (SNR) worsens because the noise in the calibration signal is difficult to effectively cancel. If the SHA is used, problems such as aperture jitter, hold mode distortion, feedthrough, and droop must be solved, and the hardware becomes expensive.

Thus, the method and apparatus for accurately determining the gain, offset, and skew calibration values of each A/D conversion circuit in a few steps are sought for an interleaving A/D converter.

SUMMARY OF THE INVENTION

A method and low cost apparatus for accurately determining the gain, offset, and skew calibration values of each A/D conversion circuit in a few steps for an interleaving A/D converter.

A further embodiment of the present invention is to provide a calibration method and apparatus for an interleaving A/D converter that would be difficult to be affected by the spurious noise and distortion of the calibration signals.

Yet a further embodiment of the present invention is to offer a calibration method and apparatus for an interleaving A/D converter that uses a clock skew adjustment method that does not use SHA, which has many problems such as aperture jitter.

The present invention provides the calibration method for an A/D converter that uses sine curve fitting to determine the calibration values in an interleaving A/D converter that uses a plurality of A/D conversion means in a predetermined order. The interleaving A/D converter of the present invention is comprised of a plurality of A/D conversion means, a data storage memory for storing the converted data, a calculation unit for selecting, reading, and applying calculations to the converted data from the data storage memory, a calibration memory for storing the obtained calibration values, a clock generator for supplying the conversion clock to the plurality of A/D conversion means, a plurality of delay elements for delaying the conversion clock to each A/D conversion means from the clock generator in accordance with the respective settings, and a reference signal generator for supplying the calibration signal.

Furthermore, the configuration method according to the present invention includes a step for applying a sine wave as the calibration signal to the input during calibration in this A/D converter, a step for A/D converting this sine wave by the plurality of A/D conversion means in a predetermined order and storing the converted data in the storage memory, and a step for determining the gain, offset, and skew calibration values by using sine curve fitting to the sequence of converted data for each of the plurality of A/D conversion means.

Another calibration method is included and has a step for storing the gain, offset, and skew calibration values in the calibration memory, a step for setting the skew calibration value in the clock delay means set in each of the plurality of A/D conversion means during normal interleaving A/D conversion, a step for A/D conversion by the plurality of A/D conversion means, and a step for fetching the data stored in memory after A/D conversion and correcting in accordance with the gain and offset calibration values stored in the calibration memory and outputting the data.

Alternately, another calibration method is included and has a step for storing the gain, offset, and skew calibration values in the calibration memory for each of the plurality of A/D conversion means, a step for setting the skew calibration value in the clock delay means provided for each of the plurality of A/D converters for each of the plurality of A/D conversion means and setting the gain and offset calibration values in the correction means for the gain and offset provided for each of the plurality of A/D conversion means during normal interleaving A/D conversion, and a step for A/D conversion by the plurality of A/D conversion means and outputting the data.

Another calibration method is included and has a step for applying sine waves having a plurality of frequencies in the step for applying the sine wave during calibration, determining the gain, offset, and skew calibration values for each of the plurality of A/D conversion means at each of the plurality of frequencies, and storing the calibration values in the calibration memory; and a step for determining and setting the gain, offset, and skew calibration values during normal interleaving A/D conversion from the calibration values for the plurality of frequencies corresponding to each of the plurality of A/D conversion means stored in the calibration memory by using the frequencies of the input signal.

DETAILED DESCRIPTION OF THE INVENTION

Figure 1:
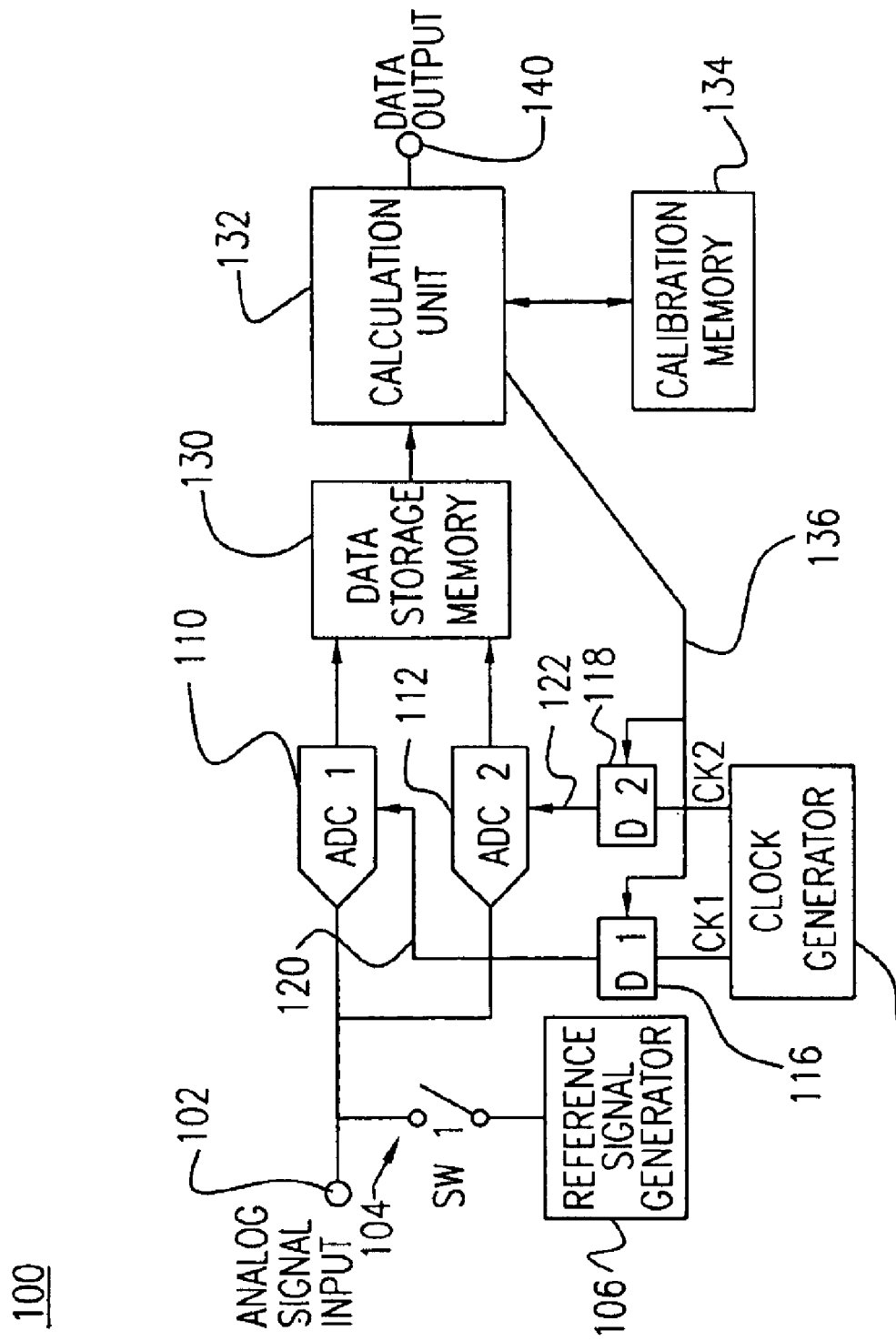
FIG. 1 is a block diagram depicting the A/D converter of an embodiment of the present invention.

The interleaving A/D converter 100 having two A/D converters, which is one embodiment of the present invention, is explained with reference to FIG. 1.

The two A/D conversion circuits ADC1 110 and ADC2 112 of the A/D converter 100 provide the conversion clock signals CK1 120 and CK2 122 having a 180° phase offset from the clock generator 114 and interleaving A/D converts the input in the order of A/D conversion circuits 110, 112, 110, 112, . . . . The delay elements 116 and 118 are provided for the conversion clock signals CK1 120 and CK2 122, respectively. The respective skews can be adjusted by setting these delay elements. The data output from ADC1 110 and ADC2 112 are stored in the data storage memory 130. Although two A/D conversion circuits were considered in this embodiment, the numbers of the A/D conversion circuits are set to 1 to 3, for example, in an embodiment of the present invention providing three A/D conversion circuits in the interleaving operation of the present invention, and the interleaving is performed in the order of, for example, 1, 2, 3, 1, 2, 3, . . . .

Figure 2A:
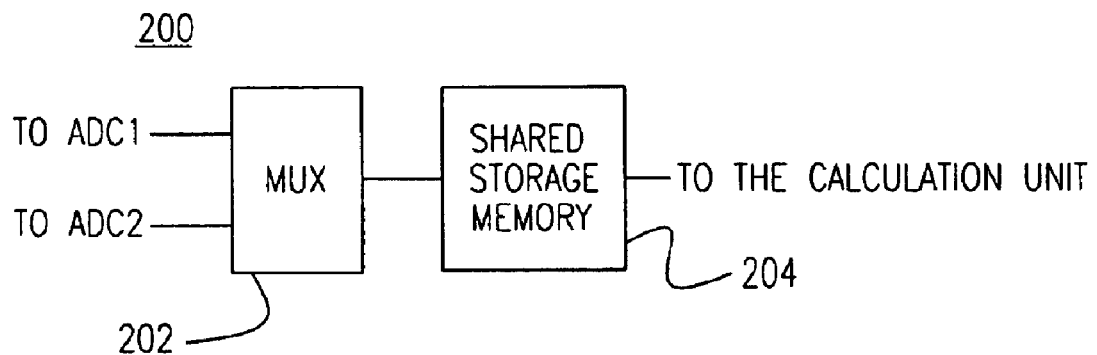
FIG. 2 is a block diagram depicting the details of the data storage memory in FIG. 1.

The two embodiments of the data storage memory are shown in FIGS. 2(a) and (b). The first embodiment 200 shown in FIG. 2(a) selects the data from ADC1 and ADC2 by the MUX, which is the multiplexer 202, and stores the data in a shared storage memory 204. The data from both A/D conversion circuits are mixed and stored in the shared storage memory 204. During measuring, which A/D conversion circuit performed the previous interleaving operation is determined. Therefore, the data generated by either A/D conversion circuit can be determined from the storage address. The address calculation can be specified and only the data generated from one A/D conversion circuit can be read out. The data stored in shared storage memory 204 is output in response to the address specification from the calculation unit 132. The calculation unit 132 can be a personal computer or a workstation and configured by using digital signal processing (DSP).

Figure 2B:
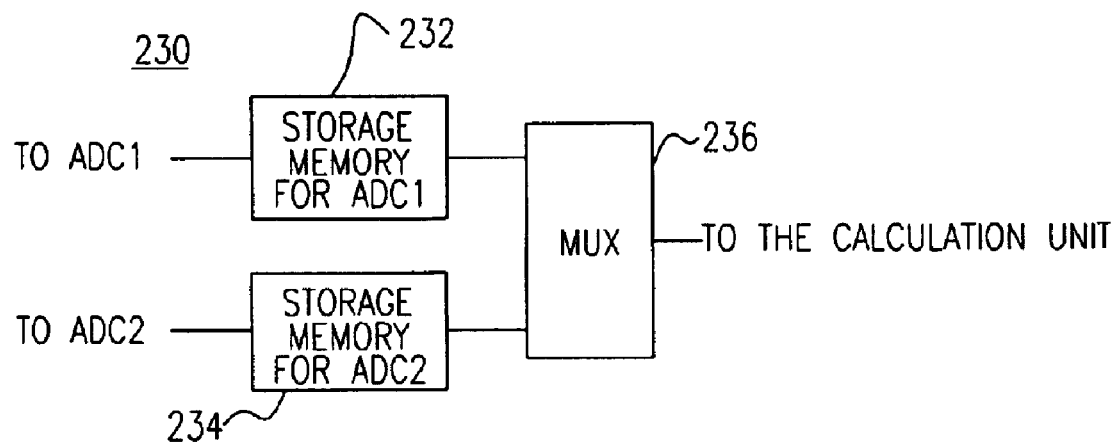

The second embodiment 230 shown in FIG. 2(b) stores the data from ADC1 in the storage memory 232 for ADC1 and stores the data from ADC2 in the storage memory 234 for ADC2, selects either the storage memory 232 for ADC1 or the storage memory 234 for ADC2 by the MUX 236 in response to requests from the calculation unit, and outputs the data. In these embodiments, only the data generated by one of the A/D conversion circuits can be read out based on the MUX setting from the calculation unit 132.

Returning to FIG. 1, the calculation unit 132 receives the data from data storage memory 130 and/or data from the calibration memory 134, calculates, and outputs the data to the data output 140 or stores the data in the calibration memory 134.

The A/D converter 100 has an internally installed reference signal generator 106 for calibration, closes the switch SW1 104 during calibration, and supplies the calibration signal to the plurality of A/D conversion circuits 110 and 112 connected to the analog signal input.

Figure 3:
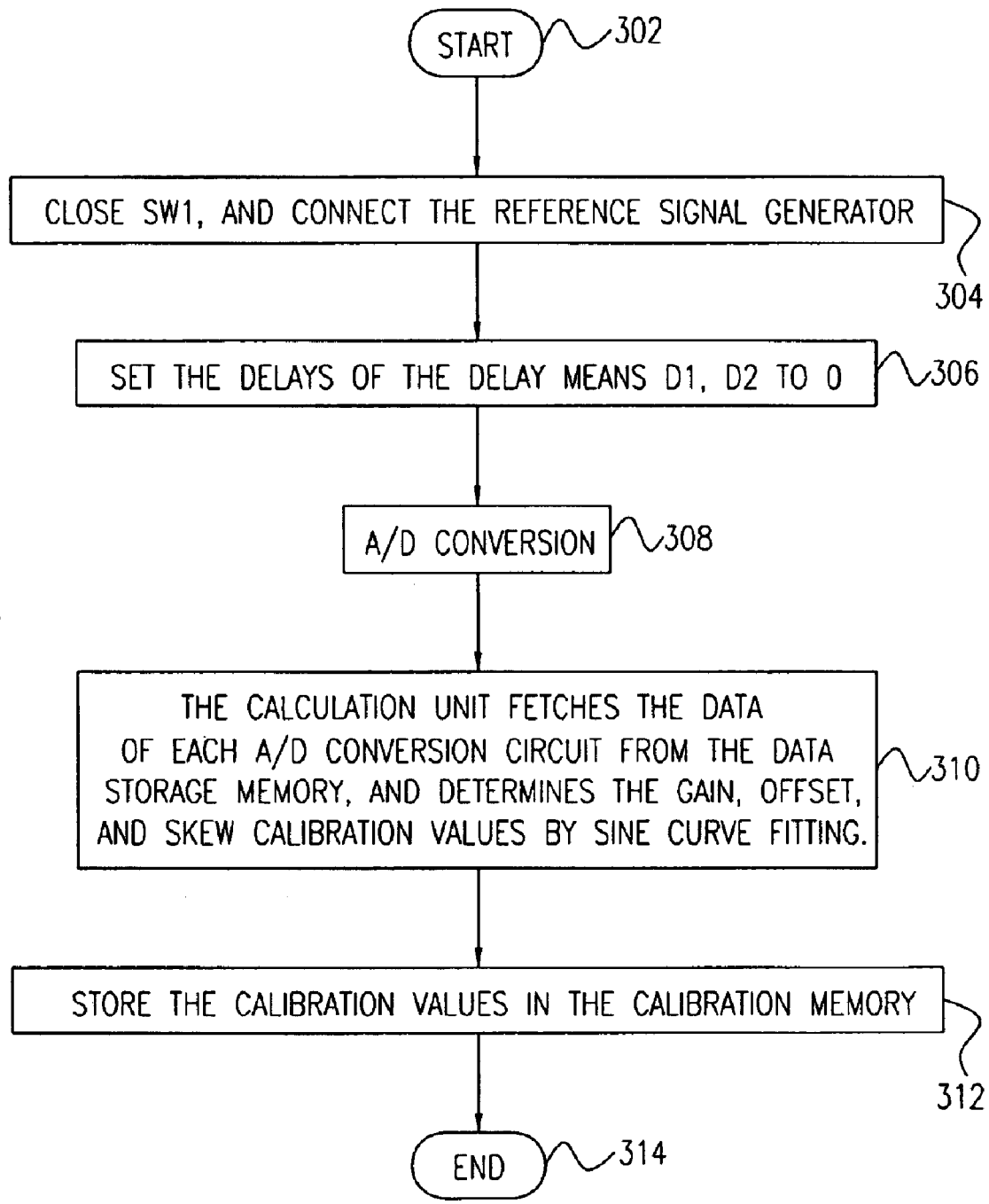
FIG. 3 is a flow chart showing the calibration method according to the present invention.

The flow chart of the calibration method using this A/D converter 100 is explained with reference to FIG. 3. First, in step 304, switch SW1 104 closes and the reference signal generator 106 is connected. Next, in step 306, the calculation unit 132 sets the delays of delay elements D1 and D2 to the value of 0. Then in step 308, the predetermined number of data are A/D converted. The method proceeds to step 310 where the calculation unit 132 fetches a sequence of data for each A/D conversion circuit from the data storage memory 130 and fits the sine function to this waveform data. In other words, by sine curve fitting, the sine wave signal used in the calibration is estimated from the waveform data, and the errors in the gain, offset, and phase are determined. The skew calibration value is determined by dividing the phase error by ($2 \times \pi \times$ frequency of the sine to wave signal used in the calibration).

Next, in step 312, the calculation unit 132 stores these calibration values in the calibration memory 134, and the calibration ends.

In particular, the gain of an A/D conversion circuit has frequency characteristics. A calibration signal for a plurality of frequencies is given. As shown in Table 1, the gain, offset, and skew calibration values at each frequency can be stored in the calibration memory 134 for each A/D conversion circuit.

TABLE 1

|   | ADC1 | | | ADC2 | | |
|---|---|---|---|---|---|---|
| f | Gain | Offset | Skew | Gain | Offset | Skew |
| Fa | G1a | O1a | S1a | G2a | O2a | S2a |
| Fb | G1b | O1b | S1b | G2b | O2b | S2b |
| . | . | . | . | . | . | . |
| . | . | . | . | . | . | . |
| . | . | . | . | . | . | . |

Figure 4:
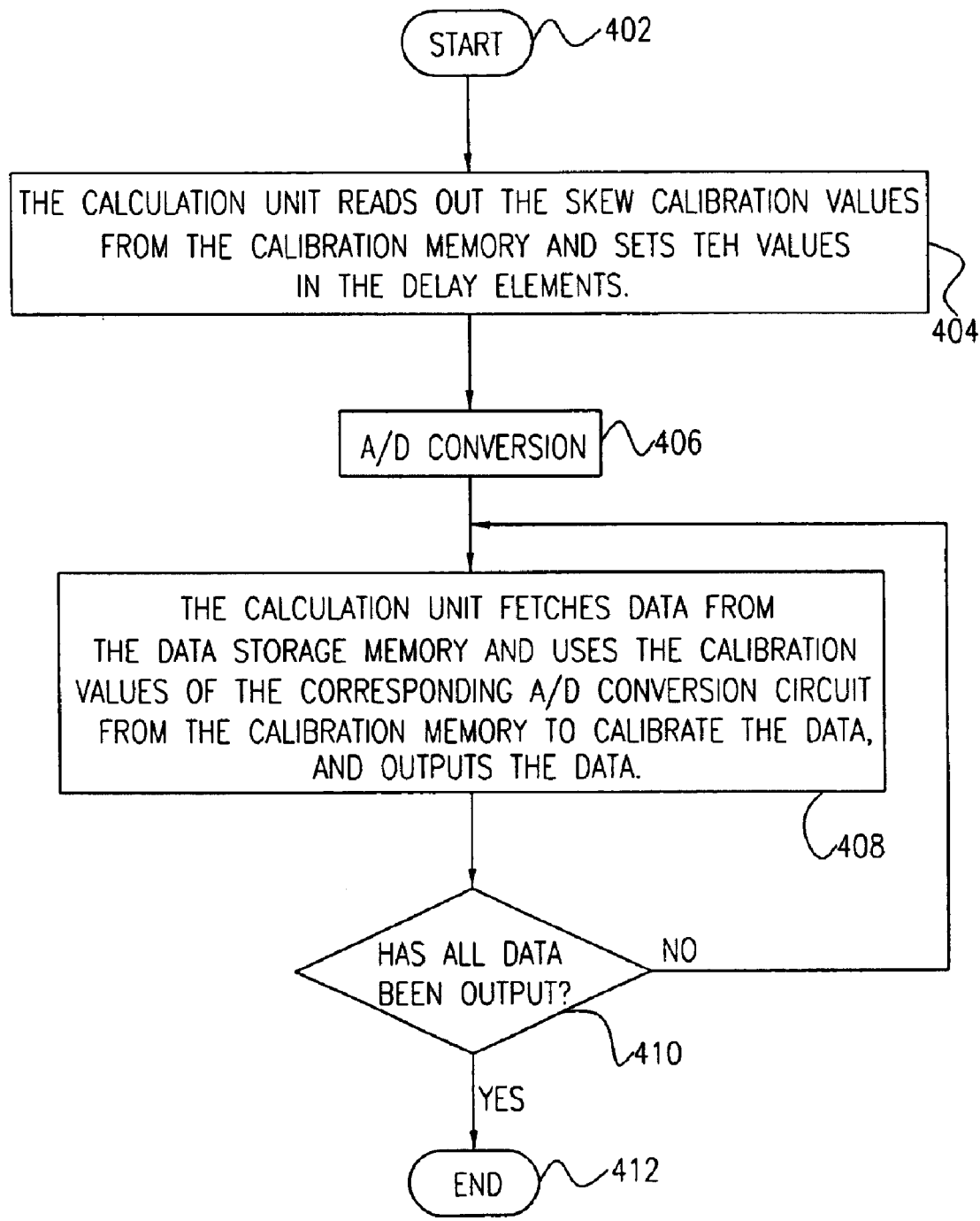
FIG. 4 is a flow chart depicting the A/D conversion method according to the present invention.

Next, the method using this A/D converter 100 to calibrate the data in actual measurements is explained with reference to the flow chart in FIG. 4.

First, before measuring, in step 404, the calculation unit 132 reads out the skew calibration value of each A/D conversion circuit from the calibration memory 134 and sets the value in each delay element 116 and 118. If the calibration values are stored for a plurality of frequencies in the calibration memory 134, the calibration value corresponding to the input frequency is selected or calculated, and set in each delay element. Next, step 406 performs the A/D conversion. After the A/D conversion ends, in step 408, the calculation unit 132 fetches the calibration value from the calibration memory and fetches the data from the data storage memory 130. The calibration values of the A/D conversion circuit determined from the address of the data are used to calibrate the data and the data are output to the data output 140. This is repeatedly applied to all of the data (step 410), and the process ends (step 412).

The A/D converter that interleaved two 128-MHz, 12-bit A/D conversion circuits according to the method and apparatus of the present invention achieves a gain error after calibration of 0.02% or less at the 1 MHz signal frequency, and a clock skew error of 4 psec or less. The Spurious Free Dynamic Range (SFDR) can reach −84 dBc compared to −65 dBc before configuration. The on-chip sine wave generator had only −50 dBc distortion performance in the reference signal generator. By using sine curve fitting, improved calibration results could be obtained even if the signal quality is not improved by using a special filter. Furthermore, by having calibration data for each input frequency, calibration results that considered the frequency characteristics of the gain can be obtained.

The conversion method according to the present invention was explained for the example of the embodiment shown in FIG. 1; however, various embodiments can be considered. For example, an embodiment can be adopted in which the gain and offset calibration hardware, for example, the DAC, is provided in ADC1 110 and ADC2 112 in FIG. 1, and during normal interleaving A/D conversion, the calculation unit 132 sets the gain and offset calibration values from the calibration memory 134 in the calibration hardware of each A/D conversion circuit. In this case, the measurement results do not have to be calibrated by the calculation unit during normal measuring. Furthermore, an embodiment is considered in which the reference signal generator 106 is not installed internally and is replaced by an external signal source.

The present invention as described above can provide a method and a low cost-apparatus for accurately determining the gain, offset, and skew calibration values for each A/D conversion circuit in a few steps for an interleaving A/D converter. In addition, a calibration method and an apparatus for an interleaving A/D converter that is difficult to affect by the spurious noise and distortion of the calibration signal can be provided. Furthermore, a calibration method and an apparatus for an interleaving A/D converter that uses a clock skew adjustment method and does not use the SHA, which has many problems such as aperture jitter, can be provided.

What is claimed is:

1. The calibration method for an analog-to-digital (A/D) converter comprising:
    determining calibration values by sine curve fitting for an interleaving A/D converter that repeatedly uses a plurality of A/D conversion devices in a predetermined order, said determining comprising:
    applying a sine wave as a calibration signal to an input during calibration;
    A/D converting said sine wave by repeatedly applying a plurality of A/D conversion devices in a predetermined order and storing a sequence of converted data in a data storage memory; and
    applying said sine curve fitting to the sequence of converted data for each of the plurality of A/D conversion devices and determining a gain, DC offset, and skew calibration values of the plurality of A/D conversion devices;
    storing the gain, DC offset, and skew calibration values in the calibration memory;
    during normal interleaving A/D conversion, setting the skew calibration value for each of the plurality of A/D conversion devices in a clock delay provided in each of the plurality of A/D conversion devices;
    performing interleaving A/D conversion by the plurality of A/D conversion devices; and
    after A/D conversion, fetching the data stored in the memory, and calibrating the data according to the gain and offset calibration values stored in the calibration memory and outputting the data.

2. The calibration method described in claim 1, further comprising:
    determining the calibration values by sine curve fitting for an interleaving A/D converter that repeatedly uses a plurality of A/D conversion devices in a predetermined order, said determining comprising:
    applying a sine wave as the calibration signal to an input during calibration;
    A/D converting said sine wave by repeatedly applying a plurality of A/D conversion devices in a predetermined order and storing a sequence of converted data in a data storage memory; and
    applying said sine curve fitting to the sequence of converted data for each of the plurality of A/D conversion devices and determining a gain, DC offset, and skew calibration values of the plurality of A/D conversion devices;
    storing the gain, DC offset, and skew calibration values in the calibration memory for each of the plurality of A/D conversion devices;
    during normal interleaving A/D conversion, setting the skew calibration value for each of the plurality of A/D conversion devices in a clock delay device provided for each of the plurality of A/D converters, and setting the gain and offset calibration values in a corrector for the gain and offset provided for each of the plurality of A/D conversion devices; and
    performing interleaving A/D conversion by the plurality of A/D conversion devices and outputting.

3. The calibration method according to claim 1, wherein the step of applying said sine wave during calibration process provides a plurality of sine waves having different frequencies and determines the gain, offset, and skew calibration values at each frequency for each of the plurality of said A/D conversion devices and stores said values in the calibration memory.

4. The calibration method according to claim 3, wherein during normal interleaving A/D conversion, the gain, offset, and skew calibration values are determined from the calibration values for the plurality of frequencies for each of the plurality of A/D conversion devices stored in the calibration memory by using the frequencies of the input signal.

5. The calibration method according to claim 2, wherein said applying said sine wave during calibration provides a plurality of sine waves having different frequencies and determines a gain, offset, and skew calibration value at each frequency for each of the plurality of A/D converters and stores said values in the calibration memory.

6. The calibration method according to claim 5, wherein during normal interleaving A/D conversion, said gain, offset, and skew calibration values are determined from the calibration values for the plurality of frequencies for each of the plurality of A/D conversion means stored in the calibration memory by using the frequencies of the input signal.

* * * * *